United States Patent
Murray

(10) Patent No.: US 6,787,862 B2
(45) Date of Patent: Sep. 7, 2004

(54) GAS INSULATED GATE FIELD EFFECT TRANSISTOR

(76) Inventor: Mark E. Murray, 12215 Fairview, Sterling Heights, MI (US) 48312

(*) Notice: Subject to any disclaimer, the term of this patent is extended or adjusted under 35 U.S.C. 154(b) by 0 days.

(21) Appl. No.: 10/324,335

(22) Filed: Dec. 19, 2002

(65) Prior Publication Data
US 2004/0119123 A1 Jun. 24, 2004

(51) Int. Cl.[7] .................. H01L 29/76; H01L 29/94; H01L 21/76

(52) U.S. Cl. .................. 257/410; 257/386; 257/394; 257/396; 257/397; 257/401; 257/412; 438/284; 438/286

(58) Field of Search ................ 257/401, 410, 257/412, 252, 253, 386, 394, 396, 397, 10, 666; 438/284, 286, 216, 261, 287, 591, 954, 981

(56) References Cited

U.S. PATENT DOCUMENTS 5,747,839 A * 5/1998 Hammond et al. ......... 257/253
6,184,585 B1 * 2/2001 Martinez et al. ........... 257/777

* cited by examiner

Primary Examiner—Donghee Kang
(74) Attorney, Agent, or Firm—Gregory T. Zalecki

(57) ABSTRACT

The present invention relates to a gas insulated gate field effect transistor and a fabricating method thereof which provides an improved insulator between the gate and the source-drain channel of a field effect transistor. The insulator is a vacuum or a gas filled trench. As compared to a conventional MOSFET, the gas insulated gate device provides reduced capacitance between the gate and the source/drain region, improved device reliability and durability, and improved isolation from interference caused by nearby electric fields. The present invention includes the steps of forming a doped source region and drain region on a substrate, forming a gate, forming a gaseous gate insulating trench and forming terminals upon the gate, the source region and the drain region. A plurality of the devices on a single substrate may be combined to form an integrated circuit.

20 Claims, 5 Drawing Sheets

GAS INSULATED GATE FIELD EFFECT TRANSISTOR

CROSS-REFERENCE

The present application is related to a copending application filed on the same date as this application entitled "Method for Fabricating a Gas Insulated Field Effect Transistor" by inventor Mark E. Murray. This application is incorporated herein by reference.

BACKGROUND

The present invention relates to a gas insulated gate field effect transistor and a method for fabricating such a transistor.

Field effect transistors have a gate, a source and a drain. A voltage applied across the gate and the substrate of the transistor causes an electric field to permeate a channel region between the source and the drain. The electric field controls current flowing through and voltage across the source and the drain. In a conventional metal oxide semiconductor field effect transistor (MOSFET) the gate is electrically isolated from the channel by an insulating layer of oxide. This creates the advantage of allowing the source and drain voltage to be controlled by a voltage applied across the gate and transistor substrate without any current flowing through the gate. Thus, significant power savings are attainable compared to bipolar junction transistors. MOSFETs may be fabricated on a very small-scale, permitting a large number of MOSFETs to reside on a small chip.

Unfortunately, MOSFETs have some significant disadvantages. Because the dielectric constant of the insulating oxide is substantially higher than air, a significant capacitance develops between the gate and the source/drain region. This limits the voltage frequencies at which MOSFETs may be successfully used. The insulating layer of oxide is subject to destruction when static electricity is applied to the MOSFET. Stability and durability of the substrate/oxide interface is less than optimal because the oxide layer is in direct contact with a crystalline silicon surface which is relatively rough. As the size of MOSFETs on an integrated circuit becomes smaller and as they become more tightly compacted the voltages and currents in one MOSFET tend to undesirably effect the operation of nearby MOSFETs.

Information relative to attempts to address these problems can be found in U.S. Pat. Nos. 5,869,379, 6,150,276, 6,188,108 B1, 6,316,294, 6,316,295 B1, 6,436,739 B1, 6,437,360 B1, 6,443,720 B1, and 6,489,683 B1.

There is a need for a gas insulated gate field effect transistor and a method for fabricating such a transistor. In such a transistor the gate is separated from the channel by a gas or a vacuum, rather than an insulating oxide.

SUMMARY

The present invention is directed to a gas insulated gate field effect transistor and a method for fabricating such a field effect transistor which addresses these problems.

The object of the present invention is to provide a gas insulated gate within a field effect transistor. This will lessen the capacitance between the gate and the source/drain region as compared to an oxide insulated MOSFET. It will also decrease the susceptibility of the insulating layer of the field effect transistor to static electricity destruction. Gasses and vacuums return to their original state typically, after the application of static electricity, while thin oxide layers are likely to be destroyed, or have their effective dielectric constants modified. An additional object of the present invention is to allow field effect transistors to be more tightly packed upon an integrated circuit chip and to be more closely positioned to neighboring field effect transistors before becoming susceptible to electrical interference from nearby field effect transistors. The fabrication step of depositing an oxide layer between the gate and the source/drain regions is avoided when gas or vacuum is used to insulate the gate.

The gas insulated gate field effect transistor is comprised of a semiconductor substrate, a doped source region, a doped drain region, an electrically conducting gate, A gate insulator consisting of a gaseous gate insulating trench, and terminals connected to the gate, the doped source region and the doped drain region. The gaseous gate insulating trench is the sole gate insulator of the gas insulated gate field effect transistor. The doped source region and the doped drain region are formed on the substrate such that the regions have a channel between them. The electrically conducting gate is formed on the substrate on one side of the gaseous gate insulating trench. The gaseous gate insulating trench and the source and drain regions are positioned such that the gate is on one side of the trench and the doped source and the doped drain regions are on the other side of the trench. The terminals are electrically connected to the gate, the doped source region and the doped drain region for providing electrical connection points. In one version of the invention the gate is comprised of metal. In another version of the invention the gate is comprised of polysilicon. When a metallic gate is used, the trench width may be precisely controlled by electroplating the gate to adjust the trench width between the gate and the channel.

A plurality of gas insulated gate field effect transistors on a semiconductor substrate may be interconnected to form an integrated circuit. Each gas insulated gate field effect transistor is fabricated on the same substrate and electrically interconnected with one or more of the other gas insulated gate field effect transistors. Input/output contacts are provided at selected points along the interconnections. Typically, integrated circuits are fabricated by isolating discrete identical circuits on the substrate and cutting the substrate into one or more chips, each chip comprising an isolated discrete identical circuit. The chip is placed within a package. External integrated circuit leads pass from within the package to outside the package. Each lead is wirebonded at its end within the package to a selected input/output contact. Preferably, a selected gas is hermetically sealed within the package at a selected absolute pressure such that the gas permeates each gaseous gate insulating trench. The selected gas may be atmospheric gas reduced to an absolute pressure approximating zero, thereby permeating the gaseous gate insulating trench with a vacuum.

Another aspect of the invention is a method for fabricating a gas insulated gate field effect transistor. A semiconductor substrate is provided. A doped source region and a doped drain region are formed on the substrate such that the regions have a channel between them. A gate pocket is formed on the substrate. A conductive layer is deposited over the surface of the substrate. The layer covers the source region, the drain region and the gate pocket. A trench area on the substrate between the gate pocket and the doped source region and the doped drain region is exposed for forming a trench. The gate pocket is on one side of the trench area. The doped source region and the doped drain region is on the other side of the trench area. A gaseous gate insulating trench is formed through the exposed trench area. A gate terminal, a source terminal and a drain terminal are formed by removing sections of the conductive layer. The conductive layer may be metal. When the gate is comprised of metal, it may be electroplated to precisely reduce the trench width between the gate and the channel.

Another aspect of the invention is a method for fabricating an integrated circuit from gas insulated gate field effect transistors. A plurality of gas insulated gate field effect transistors are fabricated, as described above, on a semiconductor substrate. A plurality of the terminals are electrically interconnected to form desirable circuits. Input/output contacts are formed at selected points along the interconnections. Discrete identical circuits are isolated on the substrate by cutting the substrate into one or more chips. A chip is placed into a package. External integrated circuit leads, passing from within the package to outside the package, are wirebonded at the lead end within the package to selected input/output contacts on the chip. Preferably, the package and gaseous gate insulating trenches are filled with a selected gas, set at a selected absolute pressure and hermetically sealed within the package. The selected gas may be atmospheric gas reduced to an absolute pressure approximating zero, thereby permeating the gaseous gate insulating trench with a vacuum.

DRAWINGS

These and other features, aspects, and advantages of the present invention will become better understood with regard to the following description, appended claims, and accompanying drawings where:

FIGS. 1A–8B show cross-sectional and top views of the fabrication of a gas insulated gate field effect transistor. The cross-sectional views have an "A" suffix. The top views have a "B" suffix.

DESCRIPTION

Figure 1A:
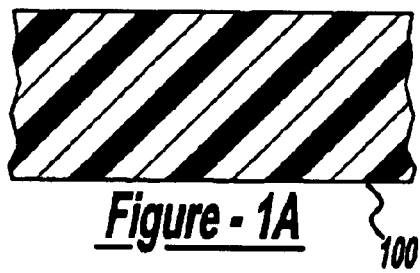
Figure 1B:
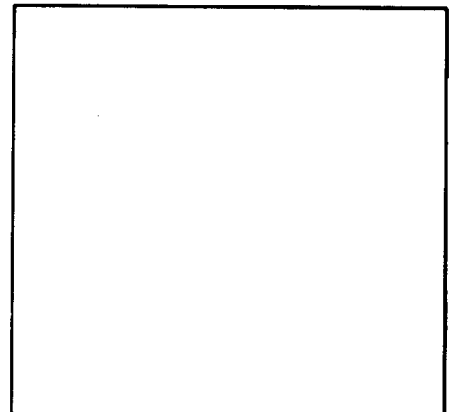

A gas insulated gate field effect transistor 134 is formed on a semiconductor substrate 100, as shown in FIG. 1A and FIG. 1B. Preferably, the gas insulated gate field effect transistor 134 is N- type and the substrate 100 is a P-type lightly doped polished silicon wafer.

Figure 2A:
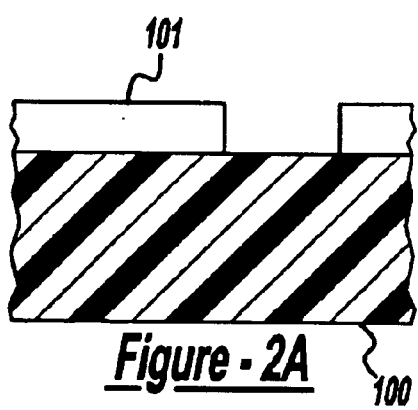
Figure 2B:
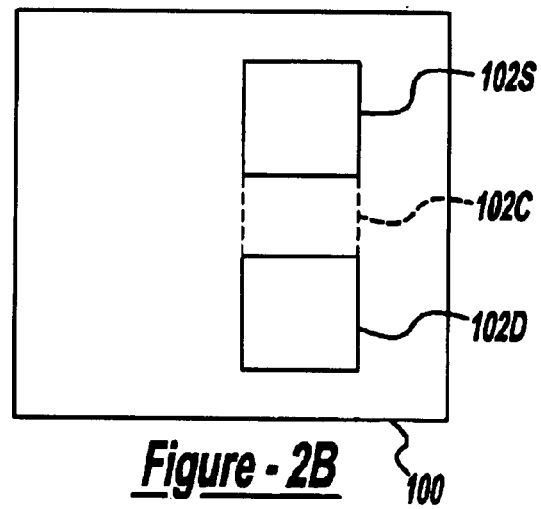
Figure 3A:
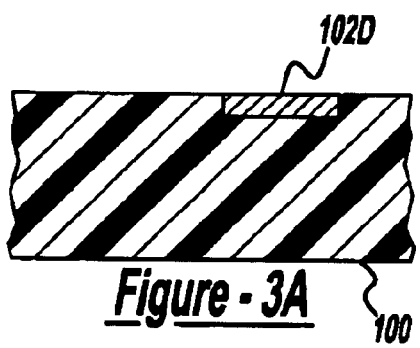
Figure 3B:
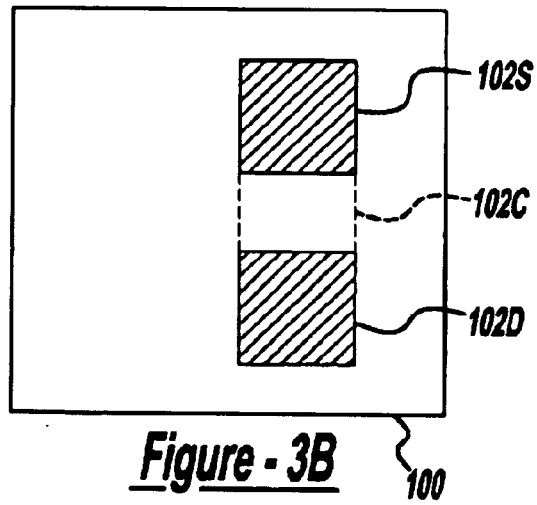

A doped source region 102S and a doped drain region 102D are formed on the substrate 100, as shown in FIG. 2A and FIG. 2B. The regions are configured to have a channel 102C between them. The doped regions 102S, 102D are geometrically defined by photolithography. Photoresist 101 is applied to the substrate 100. The photoresist 101 is masked, exposed to ultraviolet light and developed to define a source area and a drain area. The source region 102S and the drain region 102D are doped, as shown in FIG. 3A and FIG. 3B. Preferably, ion implantation is used to create the doped regions. After doping, the photoresist 101 is removed.

Figure 4A:
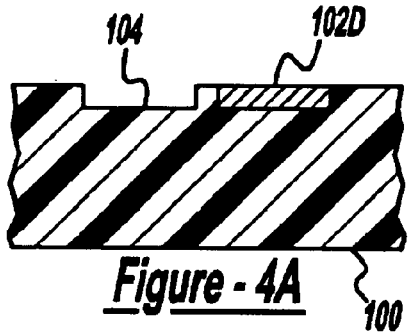
Figure 4B:
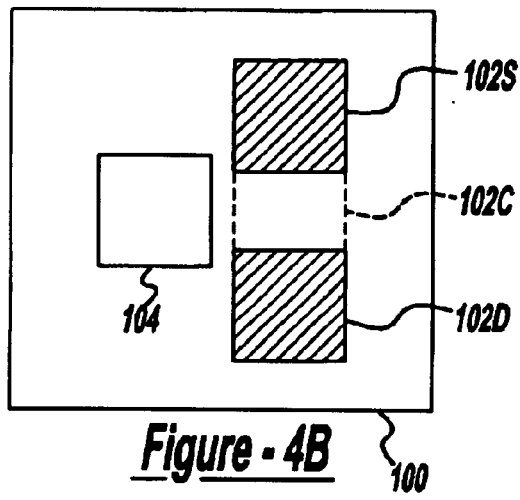

A gate pocket 104 is formed on the substrate 100 by photolithography and etching, as shown in FIG. 4A and FIG. 4B. Preferably, the gate pocket 104 has a depth which approximates the depth of the doped regions. The gate pocket 104 is a cavity shaped to form a gate when a gate material is deposited therein.

Figure 5A:
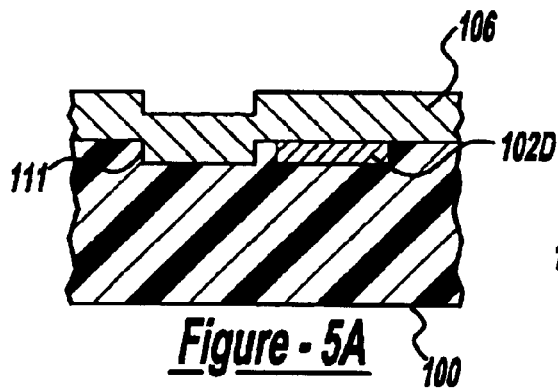
Figure 5B:
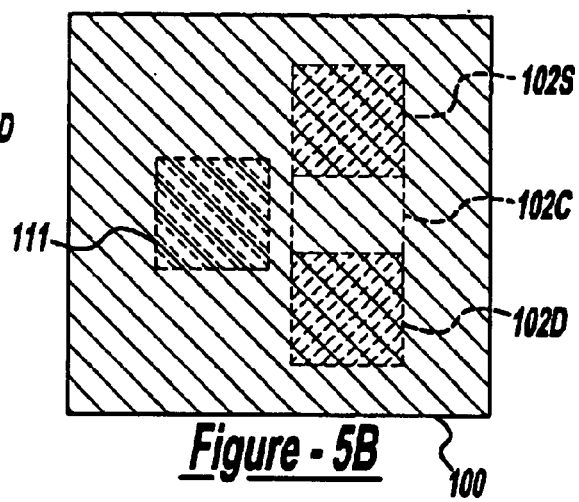

A conductive layer 106 is deposited over the surface of the substrate 100, as shown in FIG. 5A and FIG. 5B. Because the conductive layer 106 covers the surface of the substrate 100, the conductive layer 106 covers the source region 102S, the drain region 102D and the gate pocket 104. The conductive layer 106 forms a gate 111 within the gate pocket 104. The preferred conductive layer 106 is metal deposited by vapor deposition.

Figure 6A:
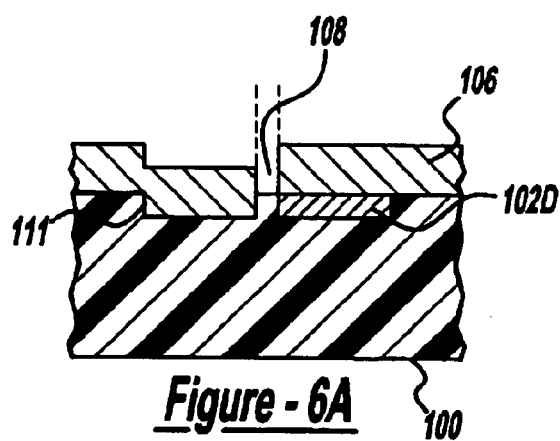
Figure 6B:
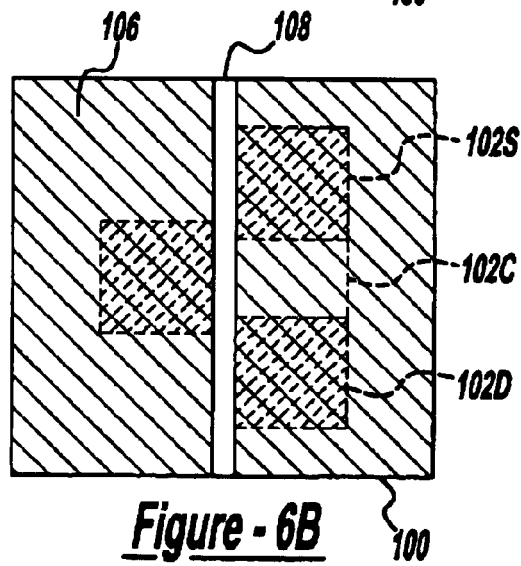

A trench area 108 is exposed on the substrate 100 between the gate 111 formed within the gate pocket 104 and the doped source region 102S and the doped drain region 102D, as shown in FIG. 6A and FIG. 6B. The exposed trench area 108 will be used for forming a gaseous gate insulating trench 110. The gate 111 within the gate pocket 104 is on one side of the trench area 108. The doped source region 102S and the doped drain region 102D are on the other side of the trench area 108. The trench area 108 is exposed by photolithography and etching.

Figure 7A:
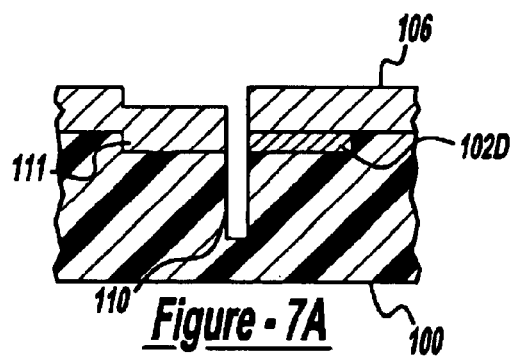
Figure 7B:
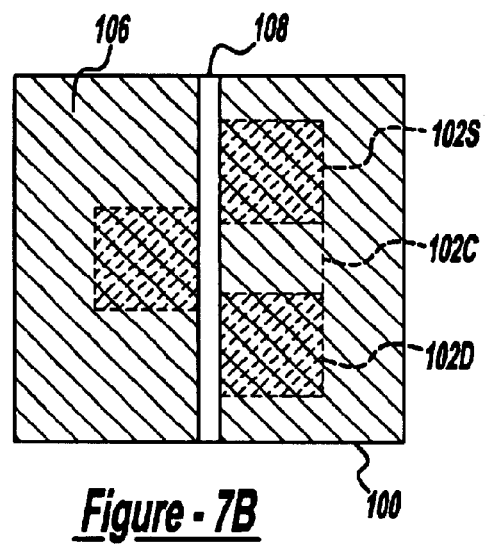

A gate insulator consisting of a gaseous gate insulating trench 110 is formed perpendicularly through the exposed trench area 108, as shown in FIG. 7A and FIG. 7B. Preferably, the gaseous gate insulating trench 110 is formed by reactive ion etching using the conductive layer 106, with the exposed trench area 108, as a mask. The gaseous Rate insulating trench 110 is the sole gate insulator of the gas insulated gate field effect transistor 134.

Figure 8A:
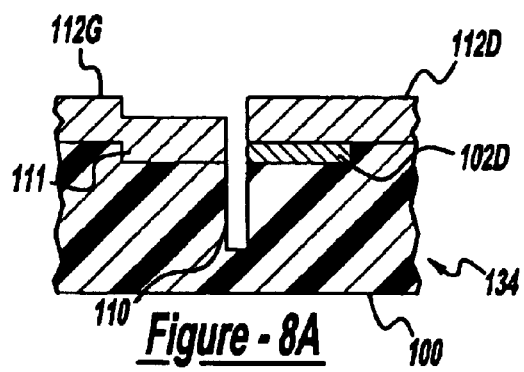
Figure 8B:
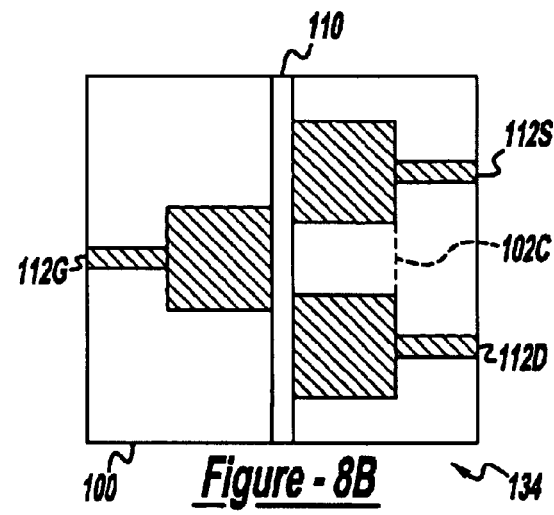

A gate 111, a gate terminal 112G, a source terminal 112S and a drain terminal 112D are formed by removing sections of the conductive layer 106, as shown in FIG. 8A and FIG. 5B. This is done using photolithography and etching.

Figure 9:
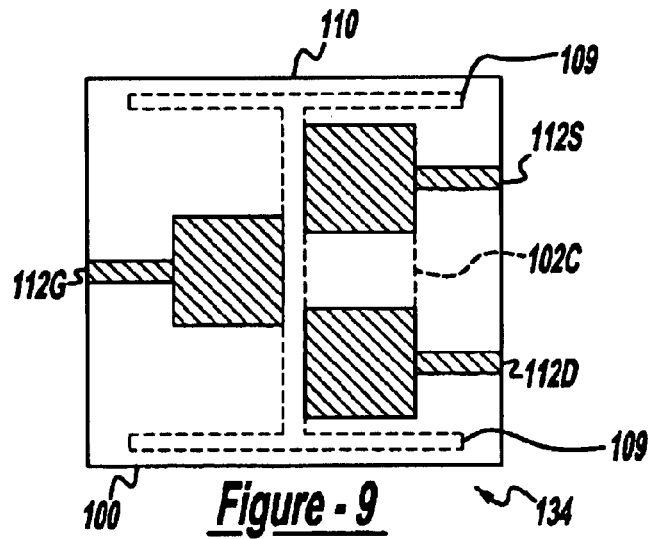
FIG. 9 is a top view of a gas insulated gate field effect transistor having an H-shaped trench.
Figure 10C:
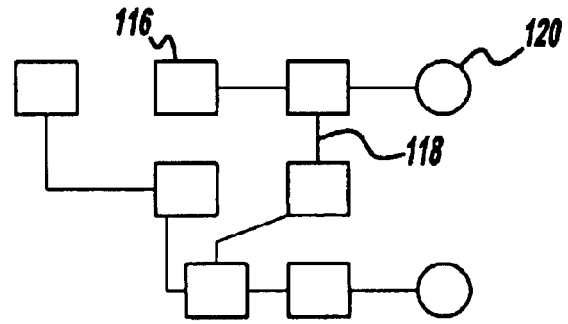
FIG. 10C is an enlarged top view of the integrated circuit of FIG. 10A showing multiple gas insulated gate field effect transistors, input/output contacts and interconnections of the gas insulated gate field effect transistors and input/output contacts.

Alternatively, the exposed trench area 108 and the gaseous gate insulating trench 110 may be shaped to have a perpendicular branch 109 at each end of the exposed trench area 108 and the gaseous gate insulating trench 110, thereby forming an H-shaped trench as shown in FIG. 9. An H-shaped trench will isolate and protect the gas insulated gate field effect transistor 134 from having its operability adversely affected by nearby currents and electric fields.

Figure 11:
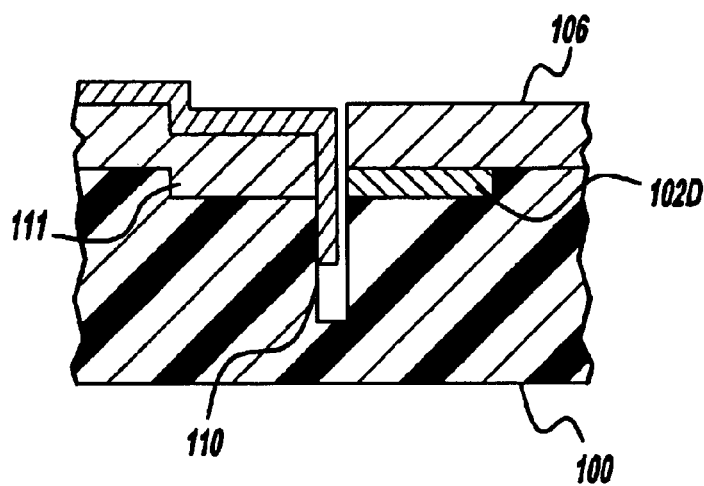
FIG. 11 is a cross-sectional view of the gas insulated gate field effect transistor having an electroplated gate.
Figure 10A:
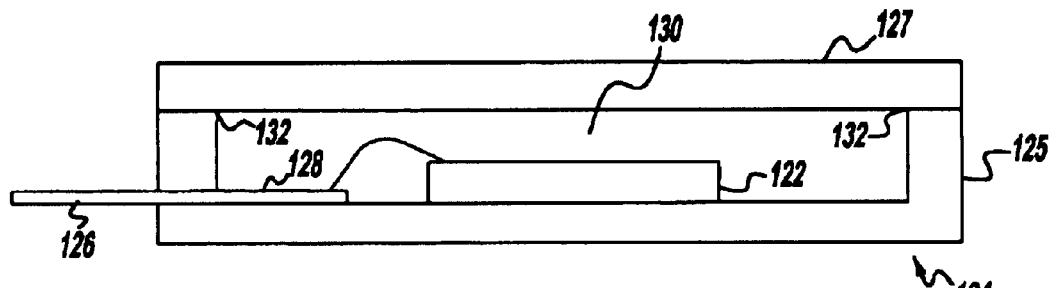
FIG. 10A is a side view of an integrated circuit comprised of multiple gas insulated gate field effect transistors.
Figure 10B:
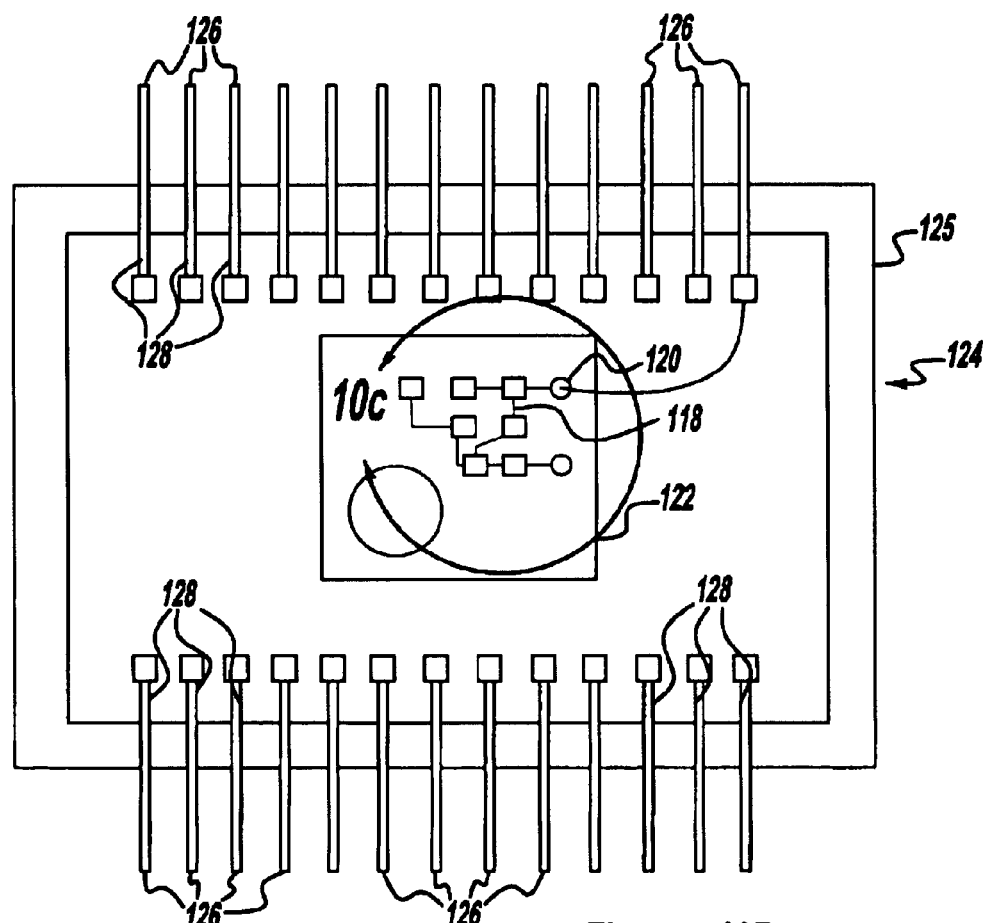
FIG. 10B is a top view of the integrated circuit of FIG. 10A.

Preferably, the gate 111 is comprised of metal. This optionally permits the width of the trench 110 between the gate 111 and the channel 102C to be precisely adjusted by electroplating the gate 111. Electroplating the gate 111 will cause a portion of the gate 111 to protrude into the trench 110, as shown in FIG. 11, thereby effectively reducing the trench 110 width.

Alternate versions of this invention include a method for fabricating an integrated circuit and an integrated circuit comprised of gas insulated gate field effect transistors. The first step in fabricating such an integrated circuit is fabricating a plurality of gas insulated gate field effect transistors 134 on a semiconductor substrate 100. Each gas insulated gate field effect transistor 134 is fabricated as described above. Interconnections 118 between a plurality of the terminals are formed to create a desirable circuit. Input/output contacts 120 are formed at selected points along the interconnections 118 for external signal communication. Discrete identical circuits are isolated on the substrate 100 by cutting the substrate 100 into one or more chips 122. A chip 122 is placed into a package 124. External integrated circuit leads 126, which pass from within the package 124 to outside the package 124, are each wirebonded at the lead end 128 within the package 124 to selected input/output contacts 120 on the chip 122. Preferably, the package 124 and the gaseous gate insulating trenches 110 are filled with a selected gas 130, set at a selected absolute pressure, followed by hermetic sealing of the package 124. The selected 130 gas may be atmospheric gas reduced to an absolute pressure approximating zero, thereby permeating the gaseous gate insulating trench 110 with a vacuum. A hermetic seal 132 is created at the interface of the body 125 of the package 124 and the top 127 of the package 124.

What is claimed is:

1. A gas insulated gate field effect transistor comprising:
   (a) a semiconductor substrate;
   (b) a doped source region and a doped drain region formed on the substrate, the regions having a channel between them;
   (c) an electrically conducting gate formed on the substrate;
   (d) a gate insulator consisting of a gaseous gate insulating trench positioned such that the gate is on one side of the trench and the doped source and the doped drain regions are on the other side of the trench, the gaseous gate insulating trench being the sole gate insulator of the gas insulated gate field effect transistor; and
   (e) a gate terminal, a source terminal and a drain terminal electrically connected to the gate, the doped source region and the doped drain region, respectively, for providing electrical connection points.

2. The gas insulated gate field effect transistor of claim 1, wherein the gate is comprised of metal.

3. The gas insulated gate field effect transistor of claim 2, wherein the gate is shaped and sized to protrude into the trench, thereby reducing the trench width between the gate and the channel between the doped source region and the doped drain region, the protruding portion of the gate being produced by a process comprising electroplating.

4. The gas insulated gate field effect transistor of claim 3, wherein the gaseous gate insulating trench is shaped to have a perpendicular branch at each end of the trench, thereby forming an H-shaped trench.

5. The gas insulated gate field effect transistor of claim 2, wherein the gaseous gate insulating trench is shaped to have a perpendicular branch at each end of the trench, thereby forming an H-shaped trench.

6. The gas insulated gate field effect transistor of claim 1, wherein the gaseous gate insulating trench is shaped to have a perpendicular branch at each end of the trench, thereby forming an H-shaped trench.

7. An integrated circuit comprising:
   (a) a plurality of interconnected gas insulated gate field effect transistors on a semiconductor substrate having input/output contacts at selected points along the interconnections, each gas insulated gate field effect transistor comprising:
      (i) a doped source region and a doped drain region formed on the substrate, the regions having a channel between them;
      (ii) an electrically conducting gate formed on the substrate;
      (iii) a gate insulator consisting of a gaseous gate insulating trench positioned such that the gate is on one side of the trench and the doped source and the doped drain regions are on the other side of the trench, the gaseous gate insulating trench being the sole gate insulator of the gas insulated gate field effect transistor; and
      (iv) a gate terminal, a source terminal and a drain terminal electrically connected to the gate, the doped source region and the doped drain region, respectively, for providing electrical connection points;
   (b) a package within which the substrate is placed;
   (c) external integrated circuit leads passing from within the package to outside the package, each lead being wirebonded at its end within the package to a selected input/output contact.

8. The integrated circuit of claim 7, wherein the gate is comprised of metal.

9. The integrated circuit of claim 8, wherein the gate is shaped and sized to protrude into the trench, thereby reducing the trench width between the gate and the channel between the doped source region and the doped drain region, the protruding portion of the gate being produced by a process comprising electroplating.

10. The integrated circuit of claim 9, wherein the gaseous gate insulating trench is shaped to have a perpendicular branch at each end of the trench, thereby forming an H-shaped trench.

11. The integrated circuit of claim 8, wherein the gaseous gate insulating trench is shaped to have a perpendicular branch at each end of the trench, thereby forming an H-shaped trench.

12. The integrated circuit of claim 7, wherein the gaseous gate insulating trench is shaped to have a perpendicular branch at each end of the trench, thereby forming an H-shaped trench.

13. The integrated circuit of claim 7, further comprising: a selected gas hermetically sealed within the package at a selected absolute pressure, such that the gas permeates each gaseous gate insulating trench.

14. The integrated circuit of claim 13, wherein the gate is comprised of metal.

15. The integrated circuit of claim 14, wherein the gate is shaped and sized to protrude into the trench, thereby reducing the trench width between the gate and the channel between the doped source region and the doped drain region, the protruding portion of the gate being produced by a process comprising electroplating.

16. The integrated circuit of claim 15, wherein the gaseous gate insulating trench is shaped to have a perpendicular branch at each end of the trench, thereby forming an H-shaped trench.

17. The integrated circuit of claim 14, wherein the gaseous gate insulating trench is shaped to have a perpendicular branch at each end of the trench, thereby forming an H-shaped trench.

18. The integrated circuit of claim 13, wherein the gaseous gate insulating trench is shaped to have a perpendicular branch at each end of the trench, thereby forming an H-shaped trench.

19. The integrated circuit of claim 18, wherein the selected gas is atmospheric gas and the selected pressure is a vacuum.

20. The integrated circuit of claim 13, wherein the selected gas is atmospheric gas and the selected pressure is a vacuum.

* * * * *